(12) United States Patent
Cai (10) Patent No.: US 12,514,070 B2
(45) Date of Patent: Dec. 30, 2025

(54) DISPLAY PANEL, METHOD FOR MANUFACTURING THE SAME, AND DISPLAY APPARATUS

(71) Applicant: WUHAN TIANMA MICRO-ELECTRONICS CO., LTD., Wuhan (CN)

(72) Inventor: Yu Cai, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 455 days.

(21) Appl. No.: 18/055,908

(22) Filed: Nov. 16, 2022

(65) Prior Publication Data
US 2023/0108581 A1   Apr. 6, 2023

(30) Foreign Application Priority Data

Sep. 9, 2022   (CN) .......................... 202211105370.2

(51) Int. Cl.
| | | |
|---|---|---|
| *H10K 59/122* | (2023.01) | |
| *H10K 50/858* | (2023.01) | |
| *H10K 59/12* | (2023.01) | |
| *H10K 59/38* | (2023.01) | |
| *H10K 71/00* | (2023.01) | |

(52) U.S. Cl.
CPC ......... *H10K 59/122* (2023.02); *H10K 50/858* (2023.02); *H10K 59/38* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | | |
|---|---|---|---|---|
| 10,388,913 B2* | 8/2019 | Jung | ...................... | H10K 59/353 |
| 10,916,722 B2* | 2/2021 | Park | ...................... | H10K 59/879 |
| 11,569,321 B2* | 1/2023 | Lee | .......................... | H10K 59/38 |

(Continued)

FOREIGN PATENT DOCUMENTS

| | | |
|---|---|---|
| CN | 113272988 A | 8/2021 |
| CN | 113328047 A | 8/2021 |

(Continued)

OTHER PUBLICATIONS

First Chinese Office Action mailed on May 21, 2025, issued in Chinese Application No. 202211105370.2; 22 pages.

*Primary Examiner* — Nishath Yasmeen
(74) *Attorney, Agent, or Firm* — CHRISTENSEN O'CONNOR JOHNSON KINDNESS PLLC (57) ABSTRACT

A display panel, a method for manufacturing the same and a display apparatus are provided. In an embodiment, the display panel includes: a substrate, a display layer located on a side of the substrate, and a light-extraction layer located on a side of the display layer opposite to the substrate. In an embodiment, he display layer includes light-emitting elements and a pixel-definition layer located between adjacent light-emitting elements. In an embodiment, he light-extraction layer includes a cushion layer, a first refracting layer and a second refracting layer that are stacked, and the first refracting layer is located between the cushion layer and the second refracting layer.

19 Claims, 8 Drawing Sheets

(56) References Cited

U.S. PATENT DOCUMENTS

| | | | |
|---|---|---|---|
| 11,616,215 B2* | 3/2023 | Lee | H10K 59/40 |
| | | | 257/40 |
| 12,035,567 B2* | 7/2024 | Kim | G06F 3/0446 |
| 2014/0339509 A1* | 11/2014 | Choi | H10K 59/879 |
| | | | 257/40 |
| 2019/0013495 A1* | 1/2019 | Kim | H10K 59/8051 |
| 2019/0221779 A1* | 7/2019 | Jang | H10K 59/126 |
| 2021/0005845 A1* | 1/2021 | Kim | G06F 3/0446 |
| 2021/0232000 A1* | 7/2021 | Zhang | G02F 1/133553 |
| 2022/0131111 A1* | 4/2022 | Lee | H10K 59/40 |
| 2022/0302419 A1* | 9/2022 | Yang | H10K 59/879 |
| 2024/0155908 A1* | 5/2024 | Zhang | H10K 59/879 |

FOREIGN PATENT DOCUMENTS

| | | |
|---|---|---|
| CN | 113437237 A | 9/2021 |
| CN | 113644222 A | 11/2021 |
| CN | 115275067 A | 11/2022 |

* cited by examiner

DISPLAY PANEL, METHOD FOR MANUFACTURING THE SAME, AND DISPLAY APPARATUS

CROSS-REFERENCE TO RELATED APPLICATION

The present application claims to the benefit of Chinese Patent Application No. 202211105370.2, filed on Sep. 9, 2022, the content of which is incorporated herein by reference in its entirety.

TECHNICAL FIELD

The present disclosure relates to the field of display technologies, and, in particular, to a display panel, a method for manufacturing the display panel, and a display apparatus.

BACKGROUND

An Organic Light-emitting Diode (OLED) has a self-luminous characteristic, and has been applied in the display field. An OLED is conducive to reduce the overall thinness and weight of the display device, and is suitable for manufacturing a flexible display screen. An OLED display panel also has the advantages of high brightness, low power consumption, fast response, high definition, good flexibility, high light emission efficiency, and can meet new needs of consumers for display technologies. However, part of large-angle light emitted by a current organic light-emitting device is limited inside the display panel, and cannot emit out of the display panel to contribute to pixel light emission, which affects overall light output efficiency of the light-emitting device.

SUMMARY

A first aspect of the present disclosure provides a display panel. In an embodiment, the display panel includes a substrate, a display layer located on a side of the substrate, and a light-extraction layer. The display layer is located between the light-extraction layer and the substrate. In an embodiment, the display layer includes light-emitting elements and a pixel-definition layer located between adjacent light-emitting elements. In an embodiment, the light-extraction layer includes a cushion layer, a first refracting layer and a second refracting layer that are stacked, and the first refracting layer is located between the cushion layer and the second refracting layer A second aspect of the present disclosure provides a display apparatus. In an embodiment, the display apparatus includes the display panel mentioned in the first aspect.

A third aspect of the present disclosure provides a method for manufacturing the display panel. In an embodiment, the method includes: providing a substrate; forming a display layer on the substrate, and the display layer including light-emitting elements and a pixel-definition layer located between adjacent light-emitting elements; forming a cushion layer on the display layer; forming a first refracting layer on the cushion layer by using an inorganic film formation process; providing a raw material for forming a second refracting layer, and mixing the raw material with a solvent to obtain a mixed solution; and coating the mixed solution on a side of the first refracting layer opposite to the substrate to form the second refracting layer.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to better understand objectives, technical solutions and advantages of the present disclosure, the technical solutions in the embodiments of the present disclosure are clearly and completely described in details with reference to the accompanying drawings. The described embodiments are merely part of the embodiments of the present disclosure rather than all of the embodiments. All other embodiments obtained by those skilled in the art based on the embodiments of the present disclosure without paying creative labor shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

Figure 1:
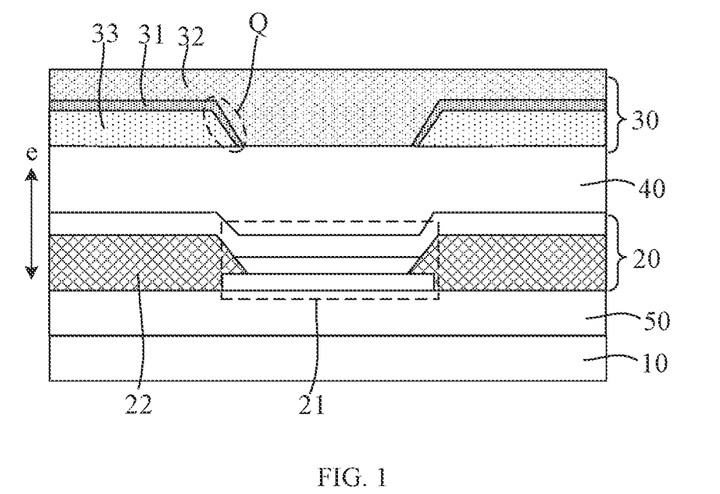
FIG. 1 is a schematic diagram of a display panel according to an embodiment of the present disclosure.

FIG. 1 is a schematic diagram of a display panel according to an embodiment of the present disclosure. As shown in FIG. 1, the display panel includes a substrate 10, a display layer 20, and a light-extraction layer 30.

The display layer 20 is located on a side of the substrate 10. The display layer 20 includes light-emitting elements 21 and a pixel-definition layer 22 located between adjacent light-emitting elements 21. The pixel-definition layer 22 is configured to separate adjacent light-emitting elements 21. The light-emitting element 21 is an organic light-emitting diode or an inorganic light-emitting diode. The light-emitting element 21 includes a first electrode, a light-emitting layer, and a second electrode that are stacked. An encapsulation layer 40 is provided on a side of the display layer 20 opposite to the substrate 10. That is, the display layer 20 is between the encapsulation layer 40 and the substrate 10. The encapsulation layer 40 is configured to isolate water and oxygen to ensure the service life of the light-emitting element 21. In an embodiment, the encapsulation layer 40 includes at least one inorganic layer and at least one organic layer. An array layer 50 is provided between the display layer 20 and the substrate 10. The array layer 50 includes pixel circuits for driving the light-emitting elements 21 to emit light.

The light-extraction layer 30 is located on the side of the display layer 20 opposite to the substrate 10. That is, the display layer 20 is between the light-extraction layer 30 and the substrate 10. The light-extraction layer 30 includes a cushion layer 33, a first refracting layer 31 and a second refracting layer 32 that are stacked. The first refracting layer 31 is located between the cushion layer 33 and the second refracting layer 32. In some embodiments, a touch layer is also provided on the side of the display layer 20 opposite to the substrate 10. The touch layer can achieve the touch function of the display panel. In an embodiment, the touch layer is located on a side of the light-extraction layer 30 adjacent to the substrate 10.

A protective layer is provided on a side of the light-extraction layer 30 opposite to the substrate 10, and an optical adhesive layer is provided between the protective layer and the light-extraction layer 30. The protective layer can be a rigid protective layer or a flexible protective layer.

The embodiments of the present disclosure provide a light-extraction layer 30 in a light-exiting direction of the light-emitting element 21. The light-extraction layer 30 can be used to improve the light output efficiency of the light-emitting element 21. The light-extraction layer 30 includes a cushion layer 33, a first refracting layer 31 and a second refracting layer 32 that are stacked. The cushion layer 33 is the bottommost layer of the stacking structure, and the cushion layer 33 can adjust the shape of the first refracting layer 31. At a position of the area Q circled in FIG. 1, the cushion layer 33 has a structure with an inclined angle, and the first refracting layer 31 covering on the cushion layer 33 can also has an inclined structure by adapting to the shape of the cushion layer 33 (the inclined structure means that it is inclined relative to a plane of the substrate), and then the interface where the first refracting layer 31 is in contact with the second refracting layer 32 forms an inclined functional interface. The functional interface can deflect the large-angle light emitted by the light-emitting element 21. After the action of the functional interface, the light deflects toward a front view direction of the display panel, reducing the probability of total reflection of the light in the display panel, and improving the light output efficiency of the light-emitting element 21. The front view direction is parallel to a direction e perpendicular to the plane of the substrate 10. In some embodiments of the present disclosure, the first refracting layer 31 does not need to use its own thickness to form a structure with an inclined angle, thereby liberating the limitation on the materials of the first refracting layer 31 and increasing the abundance of optional materials of the first refracting layer 31.

Figure 2:
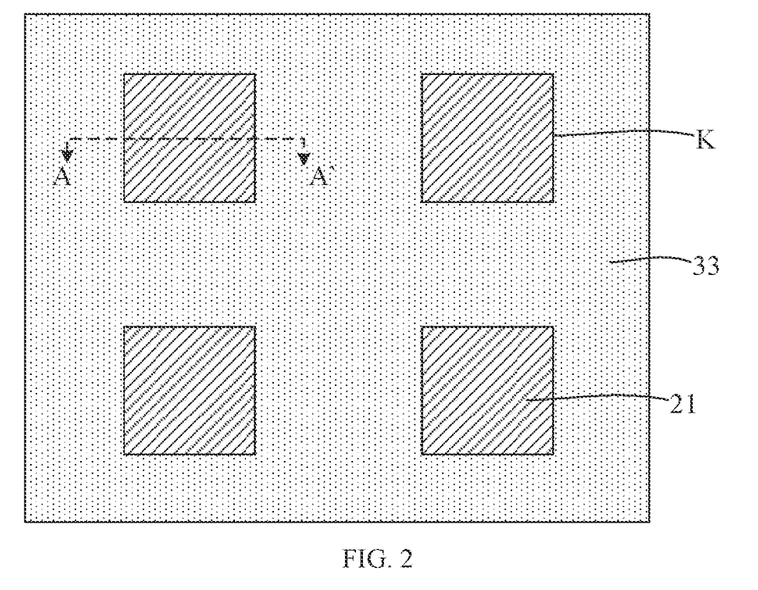
FIG. 2 is a partial top view of a display panel according to another embodiment of the present disclosure.
Figure 3:
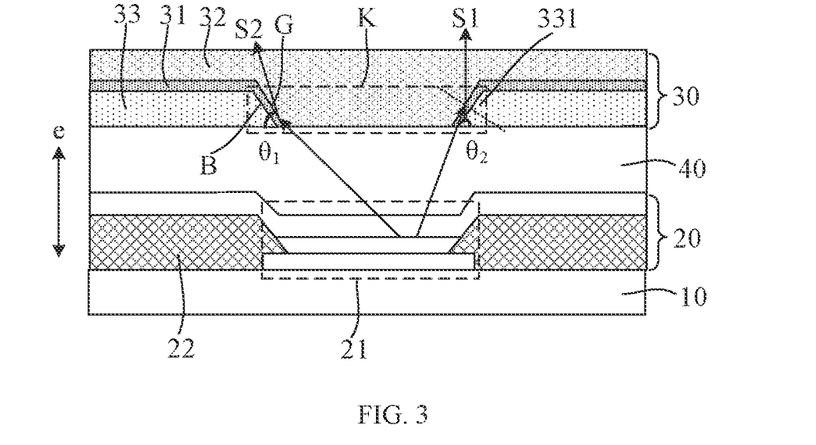
FIG. 3 is a sectional view taken along line A-A' in FIG. 2 according to an embodiment of the present disclosure.

FIG. 2 is a partial top view of a display panel according to another embodiment of the present disclosure, and FIG. 3 is a sectional view taken along line A-A' in FIG. 2 according to an embodiment of the present disclosure. In some embodiments, in order to clearly illustrate the structure of the light-extraction layer 30, only the shape of the cushion layer 33 and the light-emitting element 21 are shown in FIG. 2. The arrangement of the light-emitting elements 21 in FIG. 2 is only a schematic representation and is not a limitation to the present disclosure. It can be seen from FIG. 2 that the cushion layer 33 has an opening K, that is, the cushion layer 33 is a patterned structure. The shape of the opening K in FIG. 2 is only a schematic representation, and the shape of the opening K can be designed according to the shape of the light-emitting element 21.

In combination with FIG. 3, in a direction e perpendicular to the plane of the substrate 10, the opening K overlaps with the light-emitting element 21. The cushion layer 33 overlaps with the pixel-definition layer 22. In other words, the cushion layer 33 is located obliquely above the light-emitting element 21. The cushion layer 33 has an opening K, so that a sidewall B of the cushion layer 33 adjacent to the light-emitting element 21 is inclined, which means that a non-zero angle is formed between the sidewall B and a plane parallel to the substrate 10, so that a structure with an inclined angle is formed by using the shape of the cushion layer 33. Sidewall B is an inner wall of the opening K. In addition, in the embodiments of the present disclosure, overlapping of the cushion layer 33 and the pixel-definition layer 22 can be understood that the cushion layer 33 partially overlaps with the pixel-definition layer 22, or the cushion layer 33 completely overlaps with the pixel-definition layer 22.

In some embodiments of the present disclosure, the first refracting layer 31 covers an upper surface of the cushion layer 33 and the sidewall B, and the upper surface of the cushion layer 33 is a surface located on a side opposite to the substrate 10. The first refracting layer 31 can also form an inclined structure to adapt to the shape of the cushion layer 33, so that the first refracting layer 31 has a functional surface G having a first slope angle $\theta_1$, where $\theta_1 < 90°$. In FIG. 3, an angle formed between the functional surface G and the plane of the substrate 10 is the first slope angle $\theta_1$. The interface between the functional surface G and the second refracting layer 32 is a functional interface, which can deflect the large-angle light emitted by the light-emitting element 21, improving the light output efficiency of the light-emitting element 21. In some embodiments of the present disclosure, the first refracting layer 31 does not need to use its own thickness to form a structure with an inclined angle, thereby liberating the limitation on the materials of the first refracting layer 31 and increasing the abundance of the optional materials of the first refracting layer 31.

In some embodiments, a refractive index $n_1$ of the first refracting layer 31 and a refractive index $n_2$ of the second refracting layer 32 satisfy $n_1 < n_2$. That is, the refractive index of the first refracting layer 31 is smaller than the refractive index of the second refracting layer 32. When the large-angle light emitted by the light-emitting element 21 is incident from the first refracting layer 31 to the second refracting layer 32, the light travels from an optically thinner medium to an optically denser medium, so that an incidence angle is greater than a refraction angle. Compared with the incident light, the angle formed between the refracted light (for example, light S1 shown in FIG. 3) incident to the second refracting layer and a direction e becomes smaller, that is, the light incident to the second refracting layer 32 deflects toward the front view direction of the display panel, reducing the probability of total reflection of the light in the display panel, and improving the light output efficiency of the light-emitting element 21. As an optical path of light S2, when the large-angle light emitted by the light-emitting element 21 is incident from the second refracting layer 32 to the first refracting layer 31, the light travels from the optically denser medium to the optically thinner medium. When the incidence angle is greater than the critical angle, total reflection can occur. Compared with the incident light, an angle formed between the total reflection light and the direction e also becomes smaller, improving the light output efficiency of the light-emitting element 21.

In the embodiments of FIG. 3, a cushion layer 33 is provided surrounding the light-emitting device 21, and the cushion layers 33 corresponding to the adjacent light-emitting devices 21 are connected to each other. That means, the cushion layer 33 completely overlaps with the pixel-definition layer 22. In addition, referring to FIG. 2, the cushion layer 33 has an opening K, and the cushion layer 33 is provided circumferentially surrounding the light-emitting device 21. In other words, the cushion layer 33 forms a closed pattern in a circumferential direction of the light-emitting element 21. In other embodiments, the cushion layer 33 overlaps with the pixel-definition layer 22, and the cushion layer 33 has an opening exposing the light-emitting element 21.

Figure 4:
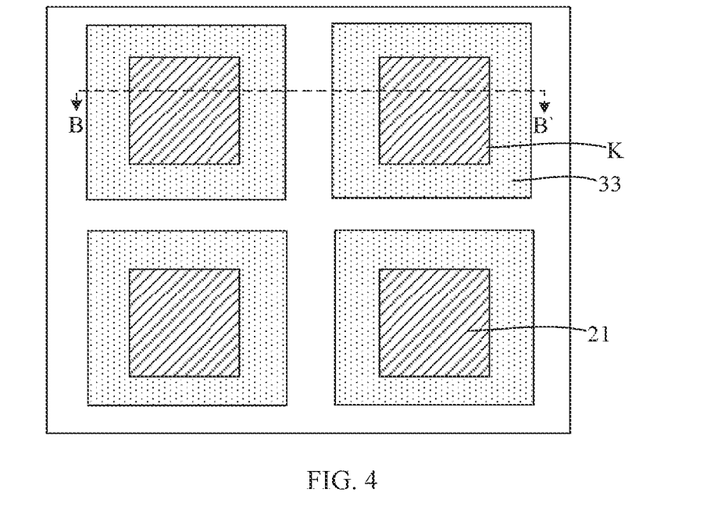
FIG. 4 is a partial top view of a display panel according to another embodiment of the present disclosure.
Figure 5:
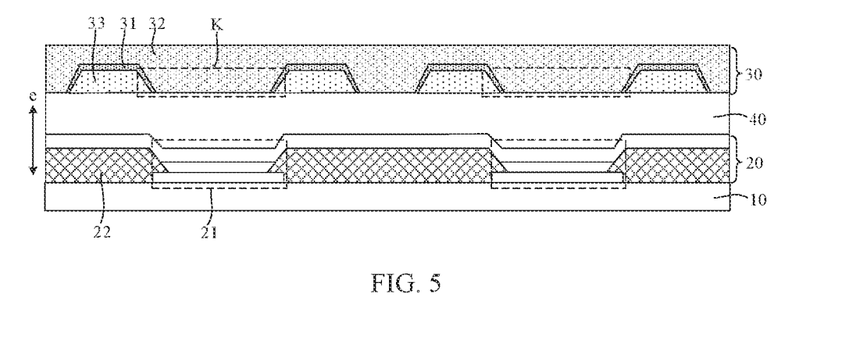
FIG. 5 is a sectional view taken along line B-B' in FIG. 4 according to an embodiment of the present disclosure.

In another embodiment, the cushion layer 33 partially overlaps with the pixel-definition layer 22. FIG. 4 is a partial top view of a display panel according to another embodiment of the present disclosure, and FIG. 5 is a sectional view taken along line B-B' in FIG. 4 according to an embodiment of the present disclosure. Referring to FIG. 4 and FIG. 5, one cushion layer 33 corresponds to one light-emitting element 21. The cushion layer 33 has an opening K which overlaps with the light-emitting element 21. The cushion layer 33 surrounding one light-emitting element 21 is separated from another cushion layer 33 surrounding another light-emitting element 21. The first refracting layer 31 covers the cushion layer 33, and the pattern shape of the first refracting layer 31 is the same as that of the cushion layer 33.

Figure 6:
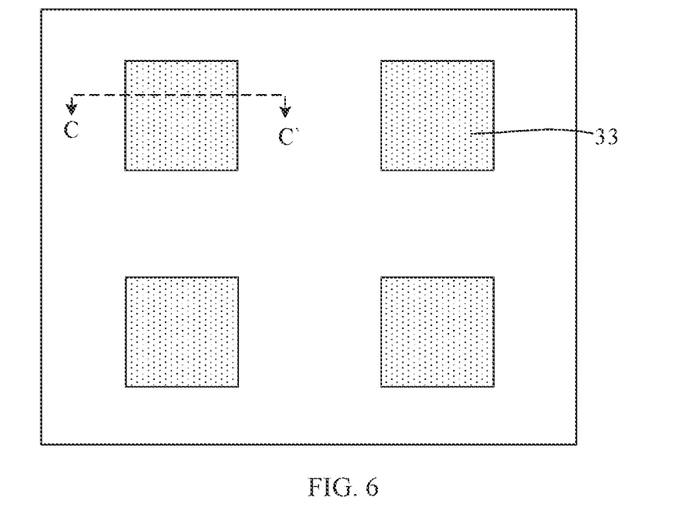
FIG. 6 is a partial top view of a display panel according to another embodiment of the present disclosure.
Figure 7:
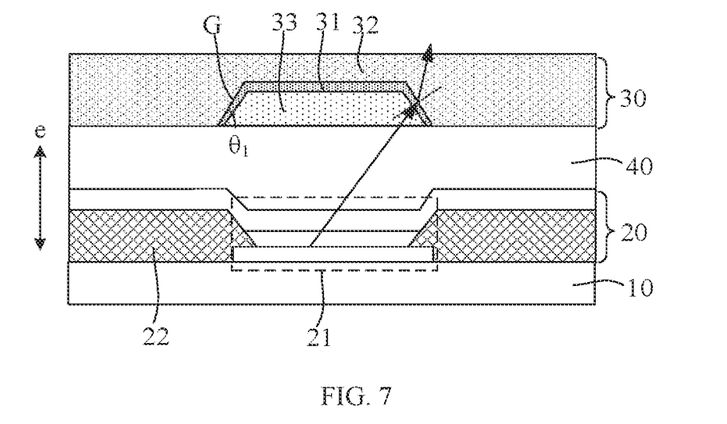
FIG. 7 is a sectional view taken along line C-C' in FIG. 6 according to an embodiment of the present disclosure.

In the embodiments of FIG. 3 and FIG. 5, the cushion layer 33 overlaps with the pixel-definition layer 22. In another embodiment, the cushion layer 33 overlaps with the light-emitting element 21. FIG. 6 is a partial top view of a display panel according to another embodiment of the present disclosure, and FIG. 7 is a sectional view taken along line C-C' in FIG. 6 according to an embodiment of the present disclosure. Referring to FIG. 6 and FIG. 7, the cushion layer 33 overlaps with the light-emitting element 21 in the direction e perpendicular to the plane of the substrate 10. In other words, the cushion layer 33 is located right above the light-emitting element 21. One cushion layer 33 corresponds to one light-emitting element 21, and adjacent cushion layers 33 are separated from each other. As shown in FIG. 7, an edge of the cushion layer 33 forms a structure with an inclined angle, and the first refracting layer 31 covers the cushion layer 33, so that the first refracting layer 31 has a functional surface G having a first slope angle $\theta_1$. In FIG. 7, an acute angle formed between the functional surface G and the plane of the substrate 10 is the first slope angle $\theta_1$. A refractive index $n_1$ of the first refracting layer 31 and a refractive index $n_2$ of the second refracting layer 32 satisfy $n_1 > n_2$. The large-angle light that is emitted by the light-emitting element 21 and travels from the first refracting layer 31 to the second refracting layer 32 travels from an optically denser medium to an optically thinner medium, and the light is refracted on the functional interface formed by the contact between the functional surface G and the second refracting layer 32, and the refraction angle is greater than the incidence angle. Compared with the incident light, the angle formed between the refracted light and the direction e is also smaller, so that the light output efficiency of the light-emitting element 21 can be improved. In the embodiments of the present disclosure, the functional surface G of the first refracting layer 31 is in contact with the second refracting layer 32 to form the functional interface. When the light emitted by the light-emitting element 21 passes through the functional interface, the light travels from the optically denser medium into the optically thinner medium. After the action of the functional interface, the large-angle light deflects toward the front view direction of the display panel, so that the probability of total reflection of the light inside the display panel is reduced, thereby improving the light output efficiency of the light-emitting element 21. The cushion layer 33 has a structure with an inclined angle, the first refracting layer 31 does not need to use its own thickness to form a structure with an inclined angle, thereby liberating the limitation on the materials of the first refracting layer 31 and increasing the abundance of optional materials of the first refracting layer 31.

In one comparison scheme, a high-refractive-index material and a low-refractive-index material cooperate with each other to improve the light out efficiency of the light-emitting element. However, the difference between the refractive index of the high-refractive-index material and the refractive index of the low-refractive-index material needs to meet a certain range. In the state-of-the-art technology, the refractive index of the low-refractive-index material cannot be made low enough, and thus the refractive index of the high-refractive-index material is also restricted. The refractive index of high-refractive-index material may be greater than 1.6. However, the high-refractive-index material has a high reflectivity, which leads to a greater reflectivity to ambient light, thereby affecting the overall reflectivity of the display panel.

In some embodiments of the present disclosure, the refractive index $n_1$ of the first refracting layer 31 satisfies $n_1 \leq 1.4$. The refractive index $n_2$ of the second refracting layer 32 satisfies $n_2 \leq 1.6$. In some embodiments of the present disclosure, the cushion layer 33 is used to adjust the shape of the first refracting layer 31, so that the first refractive layer 31 can be made of materials with lower refractive index. When the refractive index $n_1$ of the first refracting layer 31 is set to satisfy $n_1 < 1.4$, the refractive index $n_2$ of the second refracting layer 32 can be set to be not greater than 1.6, provided that the difference between the refractive index of the first refracting layer 31 and the refractive index of the second refracting layer 32 meets the design requirements. Thus, the surface refractive index of the high refracting layer in the light-extraction layer 30 can be reduced, which can also reduce the reflectivity of the high refracting layer, thereby reducing the overall reflectivity of the display panel.

In some embodiments, the material of the first refracting layer 31 includes an inorganic material. The first refracting layer 31 is made by an inorganic film forming process, so that the first refracting layer 31 has a thinner thickness, and the first refracting layer 31 can adapt to the shape of the cushion layer 33 to form an inclined structure. In addition, the first refracting layer 31 made of inorganic material may have a lower refractive index, so that the refractive index of the first refracting layer 31 can be lower than the refractive index of the conventional organic low-refractive-index layer, without developing organic materials with lower refractive index. After the refractive index of the first refracting layer 31 is reduced, the refractive index of the second refracting layer 32 can also be reduced appropriately, provided that the difference between the refractive index of the first refracting layer 31 and the refractive index of the second refracting layer 32 meets the design requirements. The second refracting layer 32 is a surface layer of the light-extraction layer 30 on a side opposite to the display layer 20. After reducing the refractive index of the second refracting layer 32, the surface reflectivity of the second refracting layer 32 can be reduced, which can also reduce the reflection of the overall structure of the display panel to the ambient light, thereby improving the display effect.

In some embodiments, the material of the first refracting layer 31 includes one or more of silicon nitride, silicon oxynitride, silicon oxide, titanium oxide or aluminum oxide.

In an embodiment, the first refracting layer 31 is made of silicon oxide.

In some embodiments of the present disclosure, the material of the second refracting layer 32 includes an organic material, so that the refractive index of the second refracting layer 32 is greater than the refractive index of the first refracting layer 31, and the interface where the first refracting layer 31 is in contact with the second refracting layer 32 can form a functional interface. In combination with the scheme that the first refracting layer 31 includes an inorganic material, the refractive index of the first refracting layer 31 is lower than the refractive index of the conventional low-refractive-index organic layer, provided that the difference between the refractive index of the first refracting layer 31 and the refractive index of the second refracting layer 32 meets the design requirements, the refractive index of the second refracting layer 32 can be reduced to reduce the surface reflectivity of the second refracting layer 32, so that the reflection of the overall structure of the display panel to the ambient light is reduced, thereby improving the display effect.

In some embodiments, the material of the cushion layer 33 includes an organic material. The thickness of the cushion layer 33 made of organic material is relatively thick, which can facilitate forming the structure with inclined angles.

In some embodiments, the refractive index $n_3$ of the cushion layer 33 satisfies $n_1 < n_3 \leq n_2$. The refractive index of the cushion layer 33 is greater than the refractive index of the first refracting layer 31, while the refractive index of the cushion layer 33 is smaller than or equal to the refractive index of the second refracting layer 32. The material of the cushion layer 33 has a wider selectable range.

In some embodiments, the material of the cushion layer 33 is the same as the material of the second refracting layer 32, so that the diversity of materials required for manufacturing the light-extraction layer 30 is reduced, thereby simplifying the manufacturing process.

In some embodiments, the material of the cushion layer 33 and the second refracting layer 32 includes, but are not limited to, acrylic resin, epoxy resin, phenolic resin, polyamide resin or polyimide resin.

In some embodiments, the thickness of the first refracting layer 31 is smaller than the thickness of the cushion layer 33. In the display panel according to embodiments of the present disclosure, the shape of the first refracting layer 31 is adjusted by the shape of the cushion layer 33, so that the first refracting layer 31 forms an inclined structure, and the thickness of the first refracting layer 31 does not need to be too thick.

Figure 8:
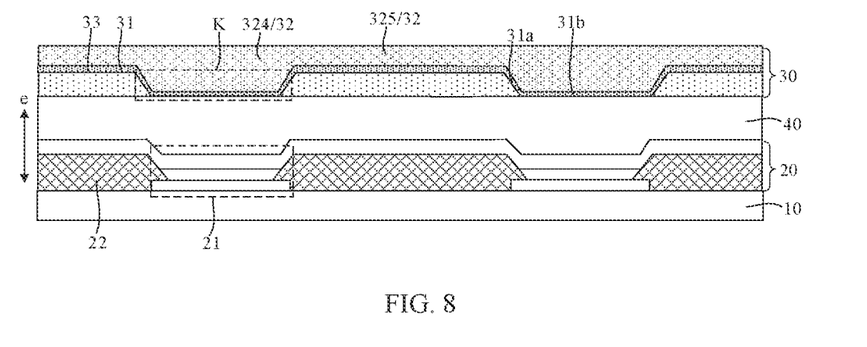
FIG. 8 is a schematic diagram of a display panel according to another embodiment of the present disclosure.

FIG. 8 is a schematic diagram of a display panel according to another embodiment of the present disclosure. In some embodiments, as shown in FIG. 8, the cushion layer 33 overlaps with the pixel-definition layer 22, and the cushion layer 33 has an opening K exposing the light-emitting element 21. The first refracting layer 31 includes a first part 31a and a second part 31b. On a side of the cushion layer 33 opposite to the substrate 10, the first part 31a covers at least part of the cushion layer 33. In the direction e perpendicular to the plane of the substrate 10, the second part 31b overlaps with the light-emitting element 21. The first part 31a and the second part 31b are in an integral structure. That is, the first part 31a and the second part 31b are connected to each other and can be formed in a same process step. As shown in FIG. 8, one side of the cushion layer 33 adjacent to the light-emitting element 21 is provided with an inclined sidewall, and an interface where the first part 31a is in contact with the second refracting layer 32 covers on the inclined sidewall and is a functional interface. In an embodiment, the second part 31b does not need to be removed by a patterning process during the formation of the first refracting layer 31, thereby simplifying the manufacturing process.

In some embodiments, the first refracting layer 31 is an entire layer structure, that is, the first refracting layers 31 corresponding to the adjacent light-emitting elements 21 are connected.

Figure 9:
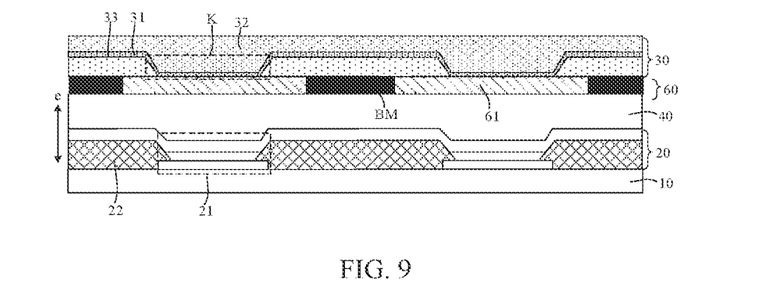
FIG. 9 is a schematic diagram of a display panel according to another embodiment of the present disclosure.

FIG. 9 is a schematic diagram of a display panel according to another embodiment of the present disclosure. In some embodiments, as shown in FIG. 9, the display panel further includes a color-filter layer 60 which can reduce the reflectivity of the display panel. The color-filter layer 60 is located between the display layer 20 and the light-extraction layer 30. The color-filter layer 60 includes multiple light-filter units 61. The light-filter units 61 at least include a red light-filter unit, a green light-filter unit and a blue light-filter unit. The display panel further includes a black matrix BM. In the direction e perpendicular to the plane of the substrate 10, the black matrix BM overlaps with the pixel-definition layer 22, and each light-filter unit 61 overlaps with the corresponding filter device 21. The second part 31b covers the light-filter unit 61. The color-filter layer 60 is located between the encapsulation layer 40 and the light-extraction layer 30. The second part 31b is in contact with the light-filter unit 61. The light-filter unit 61 includes an organic material. In some embodiments of the present disclosure, the first refracting layer 31 includes an inorganic material. The first refracting layer 31 and the light-filter unit 61 are made by different processes. Therefore, when the second part 31b covers the light-filter unit 61, mutual migration or mixing of the second part 31b and the light-filter unit 61 is avoided, which may affect their performance.

In addition, as shown in FIG. 9, in a direction e perpendicular to the plane of the substrate 10, the second part 31b of the first refracting layer 31 overlaps with the light-emitting element 21, and the second refracting layer 32 overlaps with the light-emitting element 21. That is, the second refracting layer 32 covers the second part 31b. In some embodiments of the present disclosure, the first refracting layer 31 includes an inorganic material, and the second refracting layer 32 includes an organic material. The first refracting layer 31 and the second refracting layer 32 are different in material. When the second refracting layer 32 is formed by a solvent coating process, mutual migration or mixing of the second refracting layer 32 and the first refracting layer 31 is avoided in the forming process, which can ensure their stable performance. Furthermore, the first refracting layer 31 can provide an isolation function between the light-filter unit 61 and the second refracting layer 32 to prevent mutual migration or mixing between the light-filter unit 61 and the second refracting layer 32. In addition, forming the second refracting layer 32 by the solvent coating process facilitates reducing the thickness reduction of the second refracting layer 32, and facilitates improving the bending performance of the display panel when applied in the foldable display solutions.

Figure 10:
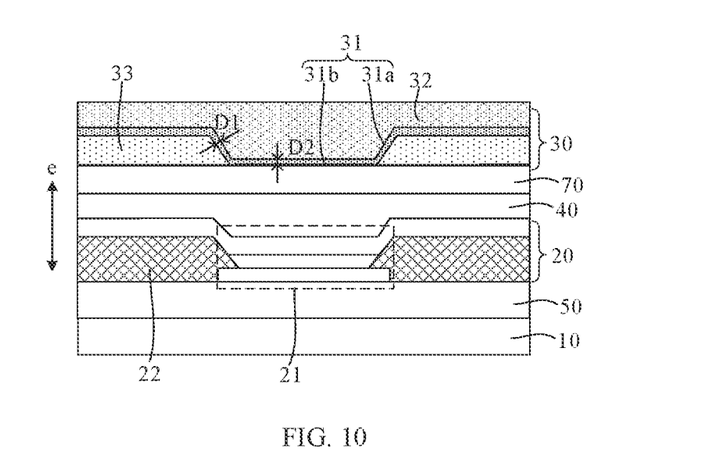
FIG. 10 is a schematic diagram of a display panel according to another embodiment of the present disclosure.

FIG. 10 is a schematic diagram of a display panel according to another embodiment of the present disclosure. In some embodiments, as shown in FIG. 10, the thickness D2 of the second part 31b is smaller than the thickness D1 of the first part 31a. In some embodiments of the present disclosure, the first refracting layer 31 includes an inorganic material, and is made by an inorganic film forming process, such as chemical vapor deposition. When the first refracting layer 31 is formed at the inclined sidewall of the cushion layer 33, the thickness at this position is relatively thin due to process limitation, so that the thickness D2 of the second part 31b is smaller than the thickness D1 of the first part 31a.

As shown in FIG. 10, the display panel includes a touch layer 70. The touch layer 70 includes a touch electrode, so that the display panel has a touch function. The touch layer 70 includes a touch metal layer and an insulation layer. The touch electrode is located in the touch metal layer. One insulation layer is provided on an outer surface of the touch layer 70 opposite to the substrate 10 to protect the touch electrode. The insulation layer is made of an inorganic material. In an embodiment, the material of the insulation layer includes silicon nitride. In some embodiments, the second part 31b is in contact with the insulation layer in the touch layer 70. The material of the second part 31b includes silicon oxide, and a refractive index of silicon nitride is greater than a refractive index of silicon oxide, so that the interface where the second part 31b is in contact with the touch layer 70 has a higher reflectivity to the light incident to the interface. Setting the thickness D2 of the second part 31b to be smaller, i.e., reducing the thickness D2 of the second part 31b in contact with the touch layer 70, can reduce the reflectivity at the interface between the second part 31b and the touch layer 70 by using a film interference principle.

Figure 11:
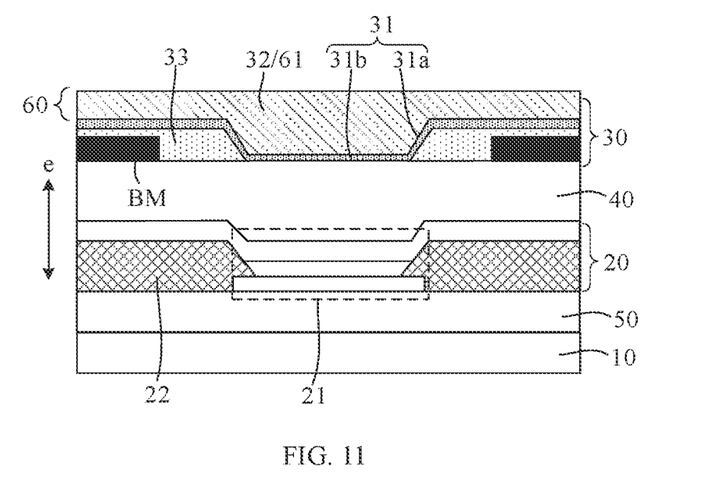
FIG. 11 is a schematic diagram of a display panel according to another embodiment of the present disclosure.

FIG. 11 is a schematic diagram of a display panel according to another embodiment of the present disclosure. In some embodiments, as shown in FIG. 11, the display panel further includes a color-filter layer 60. The color-filter layer 60 includes multiple light-filter units 61. In a direction e perpendicular to the plane of the substrate 10, each light-filter unit 61 overlaps one light-emitting element 21. The light-filter unit 61 is reused as the second refracting layer 32. The light-filtering unit 61 is made of an organic material, and a refractive index of the light-filter unit 61 is lower than a refractive index of a conventional organic layer having a high refractive index. That is, reusing the light-filter unit 61 as the second refracting layer 32 can reduce the refractive index of the high-refractive-index layer in the light-extraction layer 30, thus reducing the surface reflectivity of the second refracting layer 32, and reducing the overall reflectivity of the display panel.

As shown in FIG. 11, the display panel further includes a black matrix BM which overlaps with the pixel-definition layer 22. The cushion layer 33 covers the black matrix BM. The position of the black matrix BM in FIG. 11 is only for illustration. In another embodiment, the black matrix BM is located on a side of the light-extraction layer 30 opposite to the substrate 10, which is not shown in the drawings here.

Figure 12:
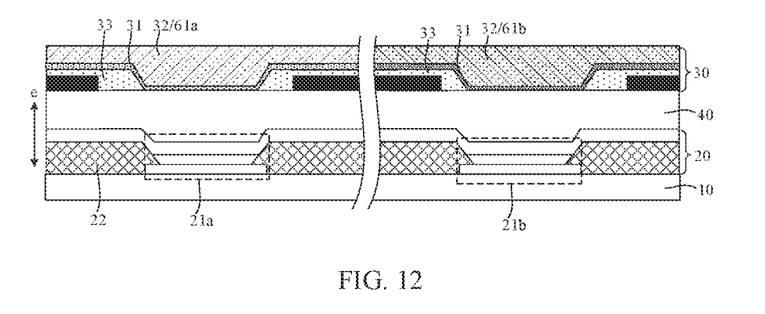
FIG. 12 is a schematic diagram of a display panel according to another embodiment of the present disclosure.

FIG. 12 is a schematic diagram of a display panel according to another embodiment of the present disclosure. In some embodiments, as shown in FIG. 12, the multiple light-filter units include a first light-filter unit 61a and a second light-filter unit 61b corresponding to different colors. For example, the first light-filter unit 61a allows light of a first color to pass through, the second light-filter unit 61b allows light of a second color to pass through, and the first color is different from the second color. A refractive index of the first light-filter unit 61a is smaller than a refractive index of the second light-filter unit 61b. The first light-filter unit 61a overlaps with the first light-emitting element 21a, and the second light-filter unit 61b overlaps with the second light-emitting element 21b. Light emitted by the first light-emitting element 21a and light emitted by the second light-emitting element 21b are different in color. A refractive index $n_{1-1}$ of the first refracting layer 31 stacked with the first light-filter unit 61a and a refractive index $n_{1-2}$ of the first refracting layer 31 stacked with the second light-filter unit 61b satisfy $n_{1-1} < n_{1-2}$. In some embodiments of the present disclosure, the refractive indices of the first refracting layers 31 corresponding to light-emitting elements of different colors can be different. When the light-filter unit is reused as the second refracting layer 32, the size of the first refracting layer 31 is appropriately adjusted according to the refractive index of the light-filter unit overlapped with the first refracting layer 31 to ensure that the difference in the refractive index between the first refracting layer 31 and the light-filter unit that overlap each other meets the design requirements, so that the first refracting layer 31 and the light-filter unit contact each other to form a functional interface for improving the light out efficiency of the light-emitting element.

In some embodiments of FIG. 12, the first light-emitting element 21a is a red light-emitting element, the first light-filter unit 61a is a red light filter unit, the second light-emitting element 21b is a green light-emitting element, and the second light-filter unit 61b is a green light filter unit.

In some embodiments of FIG. 12, the first light-emitting element 21a is a red light-emitting element, the first light-filter unit 61a is a red light filter unit, the second light-emitting element 21b is a blue light-emitting element, and the second light-filter unit 61b is a blue light filter unit.

In other embodiments, the refractive index of the light-filter unit corresponding to the red light-emitting element, the refractive index of the light-filter unit corresponding to the green light-emitting element, and the refractive index of the light-filter unit corresponding to the blue light-emitting element in the display panel satisfy: the refractive index of the red light filter unit>the refractive index of the green light filter unit>the refractive index of the blue light filter unit. The refractive index of the first refracting layer 31 stacked with the red light filter unit, the refractive index of the first refracting layer 31 stacked with the green light filter unit, and the refractive index of the first refracting layer 31 stacked with the blue light-filter unit satisfy: the refractive index of the first refracting layer 31 stacked with the red light filter unit>the refractive index of the first refracting layer 31 stacked with the green light filter unit>the refractive index of the first refracting layer 31 stacked with the blue light filter unit.

In the above embodiments of FIG. 3, the functional surface G of the first refracting layer 31 is a planar surface, and an angle that is formed between the functional surface G and a plane parallel to the substrate 10 and points to the cushion layer 33 is a first slope angle $\theta_1$.

As shown in FIG. 3, the cushion layer 33 includes a functional part 331. A thickness of the functional part 331 gradually increases in a direction from a center of the light-emitting element 21 to an edge of the light-emitting element 21. The first refracting layer 31 at the position of the functional surface G covers the functional part 331. The function part 331 has a second slope angle $\theta_2$, where $\theta_2<90°$. The sidewall of the functional part 331 is inclined, and is a planar plane, and an angle that is formed between the sidewall and a plane parallel to the substrate 10 and points to the cushion layer 33 is the second slope angle $\theta_2$. The first refracting layer 31 covering on the sidewall of the cushion layer 33 forms the planar functional surface G. The first slope angle $\theta_1$ of the functional surface G in the first refracting layer 31 is correlated with the second slope angle $\theta_2$ of the functional part 331.

Figure 13:
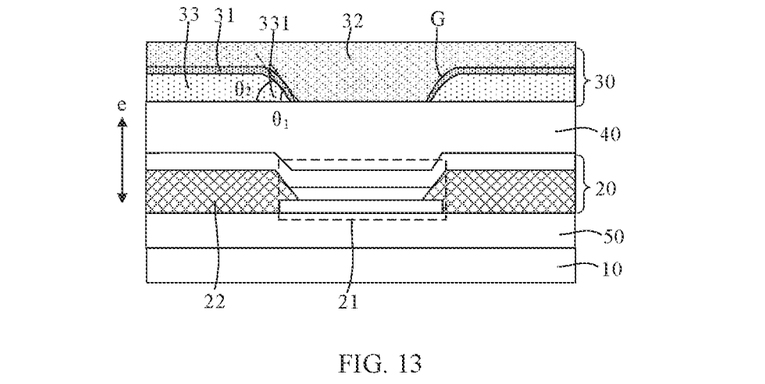
FIG. 13 is a schematic diagram of a display panel according to another embodiment of the present disclosure.

In other embodiments, the functional surface G is a curved surface. FIG. 13 is a schematic diagram of a display panel according to another embodiment of the present disclosure. As shown in FIG. 13, the first refracting layer 31 has a functional surface G. The functional surface G is in contact with the second refracting layer 32, and is a curved surface. An angle formed between a tangent plane of the functional surface G and a plane parallel to the substrate 10 and pointing to the cushion layer 33 is the first slope angle $\theta_1$, where $\theta_1<90°$. In some embodiments of the present disclosure, the cushion layer 33 is used to adjust the shape of the first refracting layer 31. The cushion layer 33 includes a functional part 331. A thickness of the functional part 331 gradually increases in a direction from a center of the light-emitting element 21 to an edge of the light-emitting element 21. The sidewall of the functional part 331 adjacent to the light-emitting element 21 is inclined, and the sidewall is a curved surface, so that the first refracting layer 31 covering the sidewall of the cushion layer 33 forms a curved functional surface G. An angle formed between the tangent plane of the sidewall and the plane parallel to the substrate 10 and pointing to the cushion layer 33 is the second slope angle $\theta_2$, where $\theta_2<90°$. In FIG. 13, the functional surface G is a convex surface projecting towards the second refracting layer 32. In another embodiment, the functional surface G is a convex surface projecting to a side opposite to the second refracting layer 32, which is not shown in the drawings here.

In the description of the following embodiments, the functional surface G of the first refracting layer 31 is still the planar surface for illustration in the drawings.

Figure 14:
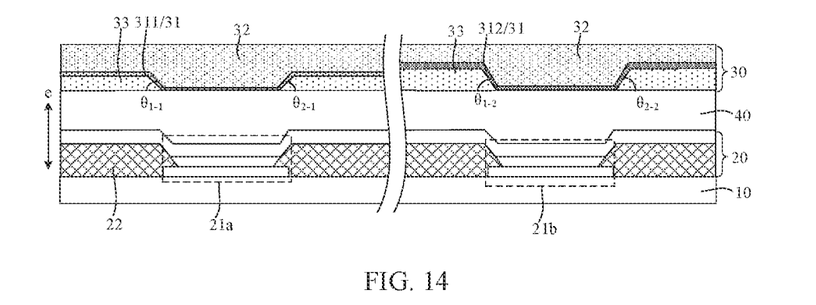
FIG. 14 is a schematic diagram of a display panel according to another embodiment of the present disclosure.

FIG. 14 is a schematic diagram of a display panel according to another embodiment of the present disclosure. In some embodiments, as shown in FIG. 14, the light-emitting elements include a first light-emitting element 21a and a second light-emitting element 21b, and the light emitted by the first light-emitting element 21a and the light emitted by the second light-emitting element 21b are different in color. The first refracting layer 31 includes a first refracting unit 311 and a second refracting unit 312. The first refracting unit 311 is adjacent to the first light-emitting element 21a, and the second refracting unit 312 is adjacent to the second light-emitting element 21b. A first slope angle $\theta_{1-1}$ of the first refracting unit 311 and a first slope angle $\theta_{1-2}$ of the second refracting unit 312 satisfy $\theta_{1-1}<\theta_{1-2}$. Referring to FIG. 3, the size of the first slope angle $\theta_1$ can affect an effect of improving the light out efficiency of the light-emitting element by the functional interface. The smaller the first slope angle $\theta_1$ is, the better the light out efficiency of the light-emitting element is. That is, more light can be deflected to improve the light out efficiency of the light-emitting element to a greater extent. In some embodiments of the present disclosure, the first slope angles of the first refracting layers 31 corresponding to different light-emitting elements are designed separately, so that the improvement of the light out efficiency of the first light-emitting element 21a can be greater than that of the second light-emitting element 21b. When the service life of the first light-emitting element 21a is small, the brightness of the first light-emitting element 21a can be appropriately reduced by improving the light-output efficiency, thereby compensating its low service life.

In some embodiments, the first light-emitting element 21a is a blue light-emitting element, and the second light-emitting element 21b is a red light-emitting element or a green light-emitting element.

In other embodiments, the first slope angle corresponding to the green light-emitting element is smaller than the first slope angle corresponding to the red light-emitting element.

In other embodiments, the first slope angle corresponding to the green light-emitting element is equal to the first slope angle corresponding to the red light-emitting element.

As shown in FIG. 14, a second slope angle $\theta_{2-1}$ of the cushion layer 33 stacked with the first refracting unit 311 and a second slope angle $\theta_{2-2}$ of the cushion layer 33 stacked with the second refracting unit 312 satisfy $\theta_{2-1}<\theta_{2-2}$. In some embodiments of the present disclosure, the cushion layer 33 is used to adjust the structure of the first refracting layer 31. The first refracting layer 31 covers on the cushion layer 33 to adapt to the inclined sidewall of the cushion layer 33 to form the functional surface. By setting $\theta_{2-1}<\theta_{2-2}$, $\theta_{1-1}<\theta_{1-2}$ can be achieved, thereby further achieving that the first slope angles in the first refracting layers 31 corresponding to the light-emitting elements emitting light of different colors are different.

FIG. 14 shows that the thickness of the cushion layer 33 stacked with the first refracting unit 311 is different from the thickness of the cushion layer 33 stacked with the second refracting unit 312. That is, a size of the second slope angle $\theta_2$ is adjusted by adjusting the thickness of the cushion layer 33.

Figure 15:
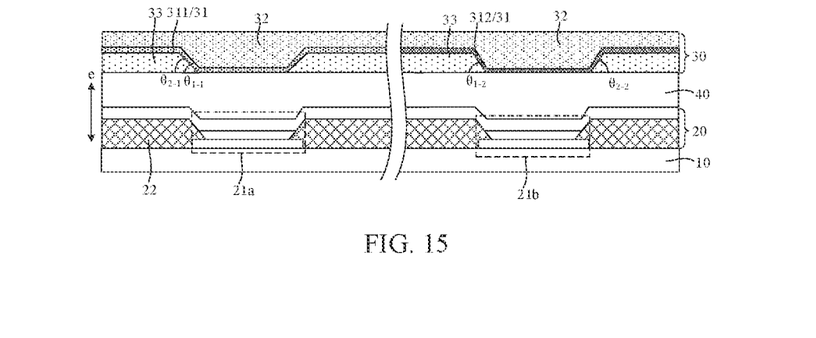
FIG. 15 is a schematic diagram of a display panel according to another embodiment of the present disclosure.

FIG. 15 is a schematic diagram of a display panel according to another embodiment of the present disclosure. In another embodiment, as shown in FIG. 15, a thickness of the cushion layer 33 stacked with the first refracting unit 311 is basically the same as a thickness of the cushion layer 33 stacked with the second refracting unit 312. The second slope angle $\theta_2$ is adjusted by adjusting the inclination degree of the sidewall of the cushion layer 33, to realize $\theta_{2-1}<\theta_{2-2}$.

Figure 16:
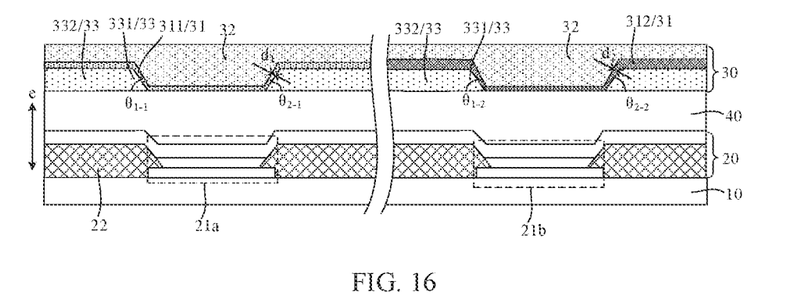
FIG. 16 is a schematic diagram of a display panel according to another embodiment of the present disclosure.

FIG. 16 is a schematic diagram of a display panel according to another embodiment of the present disclosure. In another embodiment, as shown in FIG. 16, the cushion layer 33 includes a functional part 331 and a third part 332 that are connected to each other. In a direction parallel to the plane of the substrate 10, a distance between the third part 332 and the light-emitting element 21 is greater than a distance between the functional part 331 and the light-emitting element 21. The first refracting layer 31 covers the functional part 331 and the third part 332. A thickness $d_1$ of the part in the first refracting unit 311 covering the third part 332 and a thickness $d_2$ of the part in the second refracting unit 312 covering the third part 332 satisfy $d_1<d_2$. In some embodiments of the present disclosure, the first refracting layer 31 includes an inorganic material. When the first refracting layer 31 is formed on the cushion layer 33 by deposition, the thickness of the first refracting layer 31 deposited on the inclined sidewall of the functional part 331 can affect the size of the first slope angle $\theta_1$. By setting $d_1<d_2$, $\theta_{1-1}<\theta_{1-2}$ can be achieved, such that the first slope angles in the first refracting layers 31 corresponding to the light-emitting elements emitting lights of different colors are different in size.

Figure 17:
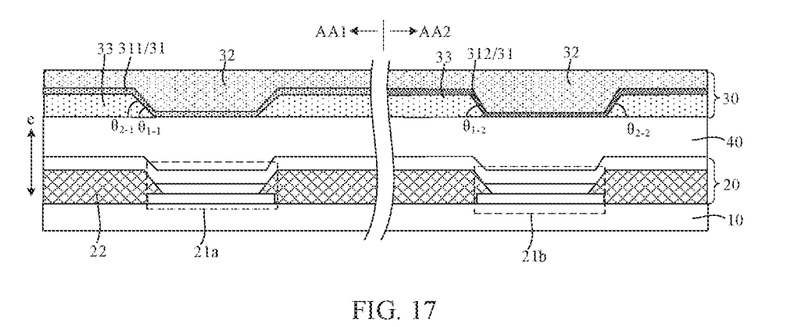
FIG. 17 is a schematic diagram of a display panel according to another embodiment of the present disclosure.

FIG. 17 is a schematic diagram of a display panel according to another embodiment of the present disclosure. In other embodiments, as shown in FIG. 17, a display region of the display panel includes a first display region AA1 and a second display region AA2. A light transmittance of the first display region AA1 is greater than a light transmittance of the second display region AA2. A density of the light-emitting elements in the first display region AA1 is smaller than a density of the light-emitting elements in the second display region AA2, or a size of the light-emitting element in the first display region AA1 is smaller than a size of the light-emitting element in the second display region AA2. The first refracting unit 311 is adjacent to the first light-emitting element 21a. The first light-emitting element 21a and the first refracting unit 311 are located in the first display region AA1. The second refracting unit 312 is adjacent to the second light-emitting element 21b. The second light-emitting element 21b and the second refracting unit 312 are located in the second display region AA2. A first slope angle $\theta_{1-1}$ of the first refracting unit 311 and a first slope angle $\theta_{1-2}$ of the second refracting unit 312 satisfy $\theta_{1-1}<\theta_{1-2}$. In the present embodiment, by setting $\theta_{1-1}<\theta_{1-2}$, the improvement degree of the light out efficiency of the first light-emitting element 21a is greater than the improvement degree of the light out efficiency of the second light-emitting element 21b, so that the brightness of the first light-emitting element 21a can be improved, thereby improving the brightness of the first display region AA1, and reducing the brightness difference between the first display region AA1 and the second display region AA2.

In some embodiments, as shown in FIG. 17, the second slope angle $\theta_{2-1}$ of the cushion layer 33 stacked with the first refracting unit 311 and the second slope angle $\theta_{2-2}$ of the cushion layer 33 stacked with the second refracting unit 312 satisfy $\theta_{2-1}<\theta_{2-2}$. In some embodiments of the present disclosure, the cushion layer 33 is used to adjust the structure of the first refracting layer 31, the first refracting layer 31 covers the cushion layer 33 to adapt to the inclined sidewall of the cushion layer 33 so to form a functional surface. By setting $\theta_{2-1}<\theta_{2-2}$, $\theta_{1-1}<\theta_{1-2}$ can be achieved, so that the first slope angle in the first refracting layer 31 corresponding to the light-emitting element in the first display region AA1 and the first slope angle in the first refracting layer 31 corresponding to the light-emitting element in the second display region AA2 are different in size, and $\theta_{1-1}<\theta_{1-2}$ is achieved accordingly.

In the embodiments of FIG. 17, the thickness of the cushion layer 33 stacked with the first refracting unit 311 is basically the same as the thickness of the cushion layer 33 stacked with the second refracting unit 312. The second slope angle $\theta_2$ is adjusted by adjusting the inclination degree of the sidewall of the cushion layer 33, so that $\theta_{2-1}<\theta_{2-2}$.

In other embodiments, the thickness of the cushion layer 33 stacked with the first refracting unit 311 is different from the thickness of the cushion layer 33 stacked with the second refracting unit 312, the second slope angle $\theta_2$ is adjusted by adjusting the thickness of the cushion layer 33, so that $\theta_{2-1}<\theta_{2-2}$, which is not shown in the drawings here.

Figure 18:
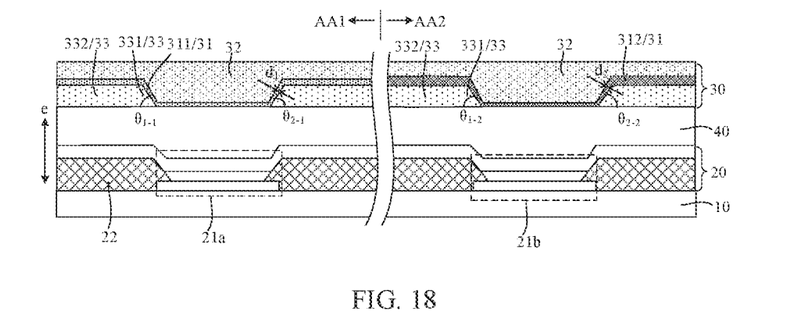
FIG. 18 is a schematic diagram of a display panel according to another embodiment of the present disclosure.

FIG. 18 is a schematic diagram of a display panel according to another embodiment of the present disclosure. In other embodiments, as shown in FIG. 18, the cushion layer 33 includes a functional part 331 and a third part 332 that are connected to each other. In a direction parallel to the plane of the substrate 10, a distance between the third part 332 and the light-emitting element 21 is greater than a distance between the functional part 331 and the light-emitting element 21. The first refracting layer 31 covers the functional part 331 and the third part 332. A thickness $d_1$ of the part of the first refracting unit 311 covering the third part 332 and a thickness $d_2$ of the part of the second refracting unit 312 covering the third part 332 satisfy $d_1<d_2$. By setting $d_1<d_2$, $\theta_{1-1}<\theta_{1-2}$ can be achieved, so that the first slope angle in the first refracting layer 31 corresponding to the light-emitting element in the first display region AA1 and the first slope angle in the first refracting layer 31 corresponding to the light-emitting element in the second display region AA2 are different in size.

In some embodiments, as shown in FIG. 8, the second refracting layer 32 includes a fourth part 324 and a fifth part 325. In a direction e perpendicular to the plane of the substrate 10, the fourth part 324 overlaps with the light-emitting element 21, and the fifth part 325 overlaps with the pixel-definition layer 22. The fourth part 324 and its adjacent parts 325 are connected. Therefore, the second refracting layer 32 is a film covering at an entire side of the first refracting layer 31 opposite to the substrate 10, it is unnecessary to perform patterning process on the second refracting layer 32 during the manufacturing process, which can simplify the manufacturing process, and the second refracting layer 32 can function as a planarization layer.

Figure 19:
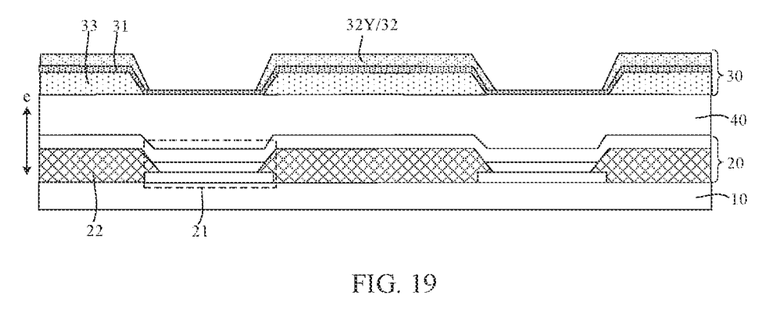
FIG. 19 is a schematic diagram of a display panel according to another embodiment of the present disclosure.

FIG. 19 is a schematic diagram of a display panel according to another embodiment of the present disclosure. In some embodiments, as shown in FIG. 19, the second refracting layer 32 includes multiple second refracting units 32y that are mutually independent. A pattern of the second refracting unit 32y is the same as a pattern of the cushion layer 33. The first refracting layer 31 is an entire layer structure, a part of first refracting layer 31 overlaps with the pixel-definition layer 22, and a part of the first refracting layer 31 overlaps with the light-emitting element 21. In an embodiment, the second refracting layer 32 is a patterned structure. The cushion layer 33 is used to adjust the shape of the first refracting layer 31, and the pattern of the second refracting unit 32y in the second refracting layer 32 is arranged to be the same as the pattern of the cushion layer 33. The interface where the second refracting unit 32y is in contact with the first refracting layer 31 is the functional interface. The functional interface is used to deflect the light emitted by the light-emitting element 21, thereby reducing the probability of total reflection of light inside the display panel, and improving the light out efficiency of light-emitting elements.

Figure 20:
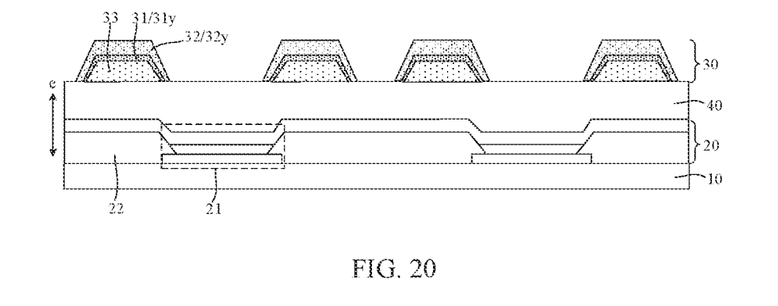
FIG. 20 is a schematic diagram of a display panel according to another embodiment of the present disclosure.

FIG. 20 is a schematic diagram of a display panel according to another embodiment of the present disclosure. In other embodiments, as shown in FIG. 20, the second refracting layer 32 includes multiple second refracting units 32y that are mutually independent, the first refracting layer 31 includes multiple first refracting units 31y that are mutually independent, and the pattern of the second refracting unit 32y is the same as the pattern of the first refracting unit 31y. In an embodiment, the first refracting layer 31 and the second refracting layer 32 are both of a patterned structure. The cushion layer 33 is used to adjust the shape of the first refracting unit 31y, and the pattern of the second refracting unit 32y is arranged to be the same as the pattern of the first refracting unit 31y. In this way, the interface where the second refracting unit 32y is in contact with the first refracting unit 31y is the functional interface, and the functional interface is used to deflect the light emitted by the light-emitting element 21, thereby reducing the probability of total reflection of light inside the display panel, and improving the light out efficiency of light-emitting elements.

In some embodiments, as shown in FIG. 1, the refractive index of the first refracting layer 31 decreases gradually in a direction perpendicular to the plane of the substrate 10 and from the display layer 20 to the light-extraction layer 30 (a direction perpendicular to a plane of the substrate opposite to the display layer). That is, the refractive index of the first refracting layer 31 gradually decreases in a light-exiting direction of the light-emitting element 21. With such a configuration, the refractive index of the part of the first refracting layer 31 that is in contact with the second refracting layer 32 is smaller, so that a large refractive index difference is formed between two sides of the interface where the first refracting layer 31 is in contact with the second refracting layer 32. Therefore, a difference between the refraction angle and the incidence angle is larger when the light passes through the functional interface. With the action of the functional interface, the deflected light is closer to the front view direction of the display panel, thereby further reducing the probability of total reflection of light inside the display panel.

In some embodiments, the material of the first refracting layer 31 includes an inorganic material, and the first refracting layer 31 is formed by an inorganic film forming process. During the forming process, the refractive index of the first refracting layer 31 can be adjusted by adjusting the conditions of the film forming process, such as adjusting a nitrogen-to-oxygen ratio in the raw material, so that the refractive index of the deposited first refracting layer 31 can be gradually reduced in the light-exiting direction of the light-emitting element 21.

In other embodiments, as shown in FIG. 1, the refractive index of the second refracting layer 32 decreases gradually in the direction perpendicular to the plane of the substrate 10 and from the display layer 20 to the light-extraction layer 30 (a direction perpendicular to a plane of the substrate opposite to the display layer). That is, the refractive index of the second refracting layer 32 gradually decreases in the light-exiting direction of the light-emitting element 21, so that the part of the second refracting layer 32 that is in contact with the first refracting layer 31 has a larger refractive index, thereby forming a larger refractive index difference between two sides of the interface where the first refracting layer 31 is in contact with the second refracting layer 32.

In some embodiments of the present disclosure, the second refracting layer 32 includes an organic material, and can be formed by a solution coating process. Doping nanoparticles in the organic material having a high-refractive-index can adjust the refractive index of the second refracting layer 32 finally formed.

In some embodiments, the second refracting layer 32 is doped with nanoparticles. The smaller the particle size is, the smaller its influence on the refractive index of the second refracting layer 32 is. In the light-exiting direction of the light-emitting element 21, the particle size of the nanoparticles doped in the second refracting layer 32 gradually decreases, so that the refractive index of the second refracting layer 32 gradually decreases in the light-exiting direction of the light-emitting element 21.

In other embodiments, the second refracting layer 32 is doped with nanoparticles. The smaller the doping density of nanoparticles is, the smaller the influence on the refractive index of the second refracting layer 32 is. In the light-exiting direction of the light-emitting element 21, the doping density of the nanoparticles doped in the second refracting layer 32 gradually decreases, so that the refractive index of the second refracting layer 32 gradually decreases in the light-exiting direction of the light-emitting element 21.

In other embodiments, the second refracting layer 32 is doped with nanoparticles. A part of the second refracting layer 32 in contact with the first refracting layer 31 and a part of the second refracting layer 32 opposite to the first refracting layer 31 are doped with nanoparticles that are different in type. Different types of nanoparticles have different refractive indices, which can gradually reduce the refractive index of the second refracting layer 32 in the light-exiting direction of the light-emitting element 21.

Figure 21:
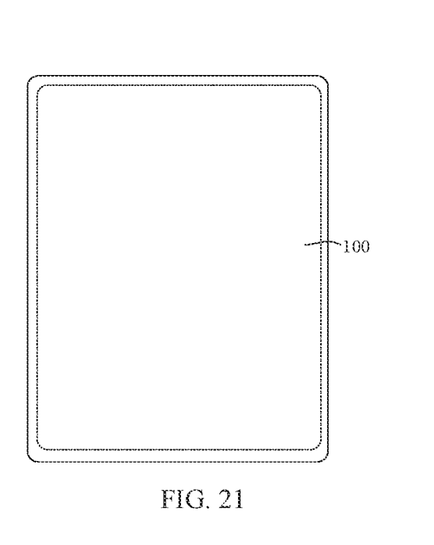
FIG. 21 is a schematic diagram of a display apparatus according to an embodiment of the present disclosure.

Based on the same concept of the present disclosure, the present disclosure provides a display apparatus. FIG. 21 is a schematic diagram of a display apparatus according to an embodiment of the present disclosure. As shown in FIG. 21, the display apparatus includes a display panel 100 provided by any embodiment of the present disclosure. The structure of the display panel 100 has been described in the above embodiments of the display panel, which will not be repeated here. The display apparatus according to embodiments of the present disclosure, for example, can be an electronic device such as a mobile phone, a computer, a TV, a vehicle-mounted display, an intelligent wearable device, and the like.

Based on the same concept of the present disclosure, the present disclosure further provides a method for manufacturing a display panel, which can be used to manufacture the display panels provided by any embodiment of the present disclosure. The embodiments of the display panel and the embodiments of the method for manufacturing the display panel can be understood by mutual reference.

Figure 22:
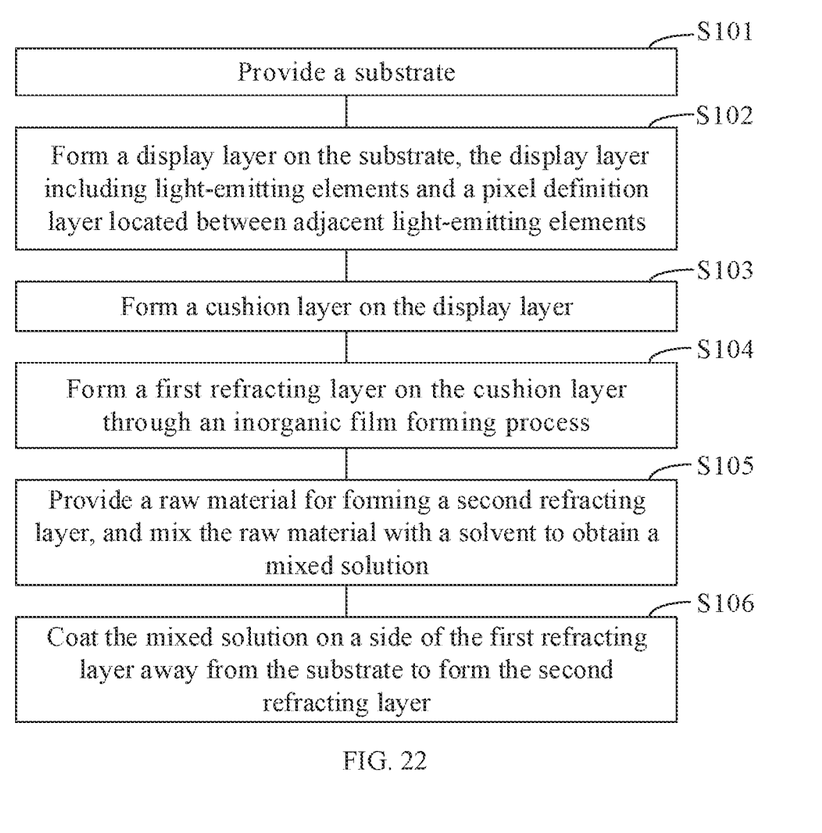
FIG. 22 is a flow chart of a method for manufacturing a display panel according to an embodiment of the present disclosure.

FIG. 22 is a flow chart of a method for manufacturing a display panel according to an embodiment of the present disclosure. As shown in FIG. 22, the method includes following steps.

At step S101: a substrate 10 is provided.

At step S102: a display layer 20 is formed on the substrate 10, and the display layer 20 includes light-emitting elements 21 and a pixel-definition layer 22 between adjacent light-emitting elements 21.

At step S103: a cushion layer 33 is formed on display layer 20.

At step S104: a first refracting layer 31 is formed on the cushion layer 33 by an inorganic film forming process.

At step S105: a raw material for forming a second refracting layer 32 are provided, and a mixed solution is obtained by mixing the raw material with a solvent.

At step S106: the mixed solution is coated on a side of the first refracting layer 31 opposite to the substrate 10 to form the second refracting layer 32.

In some embodiments of the present disclosure, the cushion layer 33, the first refracting layer 31 and the second refracting layer 32 that are stacked jointly constitute the light-extraction layer 30 capable of improving the light out efficiency of the light-emitting element 21. The cushion layer 33 can adjust the shape of the first refracting layer 31 in the manufacturing process. The first refracting layer 31 is made through the inorganic film forming process, and the second refracting layer 32 is made through a solution coating process. In the film forming process of the second refracting layer 32, the first refracting layer 31 can isolate and protect the layer below it, and prevents the solvent in the mixed solution from penetrating into the layer below the first refracting layer 31, which can result in damage to the layer below the first refracting layer 31. In addition, forming the second refracting layer 32 by the solution coating process can achieve a relatively thin thickness of the second refracting layer 32. Compared with a process without using the solution, the solution coating process can be applied in the foldable display solution to improve bending performance of the display panel.

The above are merely preferred embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A display panel, comprising:
   a substrate;
   a display layer located on a side of the substrate, wherein the display layer comprises light-emitting elements and a pixel-definition layer, and the pixel-definition layer is located between adjacent light-emitting elements of the light-emitting elements; and
   a light-extraction layer, wherein the display layer is located between the light-extraction layer and the substrate, and wherein the light-extraction layer comprises a cushion layer, a first refracting layer, and a second refracting layer that are stacked, and the first refracting layer is located between the cushion layer and the second refracting layer,
   wherein the cushion layer is in direct contact with the first refracting layer, the first refracting layer has a smaller thickness than the cushion layer, and a refractive index $n_1$ of the first refracting layer, a refractive index $n_2$ of the second refracting layer and a refractive index $n_3$ of the cushion layer satisfy $n_1 < n_3 \leq n_2$.

2. The display panel according to claim 1, wherein the cushion layer overlaps with the pixel-definition layer.

3. The display panel according to claim 1, wherein the refractive index $n_1$ of the first refracting layer and a refractive index $n_2$ of the second refracting layer satisfy $n_1 < n_2$.

4. The display panel according to claim 1, wherein a material of the first refracting layer comprises an inorganic material.

5. The display panel according to claim 1, wherein the refractive index $n_1$ of the first refracting layer satisfies $n_1 \leq 1.4$.

6. The display panel according to claim 1, wherein a refractive index $n_2$ of the second refracting layer satisfies $n_2 \leq 1.6$.

7. The display panel according to claim 1, wherein a material of the cushion layer comprises an organic material.

8. The display panel according to claim 1, wherein a material of the cushion layer is the same as a material of the second refracting layer.

9. The display panel according to claim 1, wherein the cushion layer defines an opening that overlaps with one of the light-emitting elements.

10. The display panel according to claim 1, wherein a sidewall of the cushion layer adjacent to a light-emitting element of the light-emitting elements is inclined with respect to the substrate, and the first refracting layer covers an upper surface and the sidewall of the cushion layer.

11. The display panel according to claim 1, wherein the first refracting layer comprises a first part and a second part, the first part is located on a side of the cushion layer opposite to the substrate and covers at least part of the cushion layer, and the second part overlaps one of the light-emitting elements, and wherein the first part and the second part are in an integral structure.

12. The display panel according to claim 11, further comprising a color-filter layer located between the display layer and the light-extraction layer, wherein the color-filter layer comprises a plurality of light-filter units each overlapping one of the light-emitting elements, and the second part covers one of the plurality of light-filter units.

13. The display panel according to claim 11, wherein a thickness of the second part is smaller than a thickness of the first part.

14. The display panel according to claim 1, further comprising a color-filter layer, wherein the color-filter layer comprises a plurality of light-filter units, wherein each light-filter unit of the plurality of light-filter units overlaps with a light-emitting element of the light-emitting elements, and wherein light-filter units of the plurality of light-filter units are reused as the second refracting layer.

15. The display panel according to claim 1, wherein the first refracting layer has a functional surface that is in contact with the second refracting layer, and the functional surface has a first slope angle $\theta_1$, where $\theta_1 < 90°$; and
   wherein the functional surface is a planar surface, and an angle that is formed between the functional surface and a plane parallel to the substrate and points to the cushion layer is the first slope angle; or wherein the functional surface is a curved surface, and an angle that is formed between a tangent plane of the functional surface and the plane parallel to the substrate and points to the cushion layer is the first slope angle.

16. The display panel according to claim 1, wherein the second refracting layer comprises a plurality of second refracting units that are independent from each other; and
   wherein a pattern of a second refracting unit of the plurality of second refracting units is the same as a pattern of the cushion layer; or wherein the first refracting layer comprises a plurality of first refracting units that are independent from each other, and a pattern of a second refracting unit of the plurality of second refracting units is the same as a pattern of one of the plurality of first refracting units.

17. A display apparatus comprising a display panel, wherein the display panel comprises:
   a substrate;
   a display layer located on a side of the substrate, wherein the display layer comprises light-emitting elements and a pixel-definition layer, and the pixel-definition layer is located between adjacent light-emitting elements of the light-emitting elements; and
   a light-extraction layer, wherein the display layer is located between the light-extraction layer and the substrate, and wherein the light-extraction layer comprises a cushion layer, a first refracting layer and a second refracting layer that are stacked, and the first refracting layer is located between the cushion layer and the second refracting layer,
   wherein the cushion layer is in direct contact with the first refracting layer, the first refracting layer has a smaller thickness than the cushion layer, and a refractive index $n_1$ of the first refracting layer, a refractive index $n_2$ of the second refracting layer and a refractive index $n_3$ of the cushion layer satisfy $n_1 < n_3 \leq n_2$.

18. A display panel, comprising:
a substrate;
a display layer located on a side of the substrate, wherein the display layer comprises light-emitting elements and a pixel-definition layer, and the pixel-definition layer is located between adjacent light-emitting elements of the light-emitting elements;
a light-extraction layer, wherein the display layer is located between the light-extraction layer and the substrate, and wherein the light-extraction layer comprises a cushion layer, a first refracting layer, and a second refracting layer that are stacked, and the first refracting layer is located between the cushion layer and the second refracting layer; and
a color-filter layer, wherein the color-filter layer comprises a plurality of light-filter units, wherein each light-filter unit of the plurality of light-filter units overlaps with a light-emitting element of the light-emitting elements, and wherein light-filter units of the plurality of light-filter units are reused as the second refracting layer.

19. A display apparatus comprising the display panel of claim 18.

* * * * *